(12) United States Patent
Lee et al.

(10) Patent No.: US 8,664,700 B2
(45) Date of Patent: Mar. 4, 2014

(54) BIO MATERIAL RECEIVING DEVICE AND METHODS OF MANUFACTURING AND OPERATING THE SAME

(75) Inventors: June-young Lee, Anyang-si (KR); Su-hyeon Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 213 days.

(21) Appl. No.: 13/096,173

(22) Filed: Apr. 28, 2011

(65) Prior Publication Data

US 2012/0019315 A1 Jan. 26, 2012

(30) Foreign Application Priority Data

Jul. 26, 2010 (KR) .................. 10-2010-0072099

(51) Int. Cl.
*G01N 27/414* (2006.01)

(52) U.S. Cl.
USPC ............... 257/252; 257/52; 257/57; 257/253; 257/59; 205/777.5

(58) Field of Classification Search
None
See application file for complete search history.

(56) References Cited

U.S. PATENT DOCUMENTS

| 5,357,290 | A | * | 10/1994 | Horibe ..................... 348/792 |
| 2007/0254455 | A1 | * | 11/2007 | Yamaguchi et al. .......... 438/455 |
| 2009/0189148 | A1 | * | 7/2009 | Araumi et al. ................. 257/40 |

FOREIGN PATENT DOCUMENTS

| JP | 2002214142 A | 7/2002 |
| KR | 1020080069995 A | 7/2008 |
| KR | 1020090029045 A | 3/2009 |
| KR | 1020090116652 A | 11/2009 |
| KR | 1020100038961 A | 4/2010 |
| WO | 02/48701 A2 | 6/2002 |
| WO | 2006/058263 A2 | 6/2006 |

* cited by examiner

*Primary Examiner* — Fei Fei Yeung Lopez
(74) *Attorney, Agent, or Firm* — Leydig, Voit & Mayer, Ltd.

(57) ABSTRACT

A bio material receiving device includes a thin film transistor ("TFT") including a drain electrode, and a nano well accommodating a bio material. The drain electrode includes the nano well. The TFT may be a bottom gate TFT or a top gate TFT. A nano well array may include a plurality of bio material receiving devices. In a method of operating the bio material receiving device, each of the bio material receiving devices may be individually selected in the nano well array. When the bio material is accommodated in the selected bio material receiving device, a voltage is applied so that another bio material is not accommodated.

10 Claims, 3 Drawing Sheets

BIO MATERIAL RECEIVING DEVICE AND METHODS OF MANUFACTURING AND OPERATING THE SAME

CROSS-REFERENCE TO RELATED APPLICATIONS

This application claims priority to Korean Patent Application No. 10-2010-0072099, filed on Jul. 26, 2010, and all the benefits accruing therefrom under 35 U.S.C. §119, the disclosure of which is incorporated herein in its entirety by reference.

BACKGROUND

1. Field

Provided is a bio device, and more particularly, a bio material receiving device and methods of manufacturing and operating the same.

2. Description of the Related Art

In nano well array systems, a plurality of wells for reacting traces of biological and chemical molecules and monitoring a reacting result are arranged in an array so as to simultaneously check various types of repetitive results in a local area.

In nano well array systems, a nano well array has a depth and a width from about several tens to about several hundreds of nanometers, and is formed of a metal on a substrate. Reaction of molecules occurring in a nano well is monitored.

A method of selectively adjusting a specific molecule by using an electric field includes moving molecules in a direction of a surface of an electrode or in a direction opposite thereto by using an electrophoresis force. In addition, the method of selectively adjusting a specific molecule includes inducing pH variations by increasing an amount of protons at a surface of an electrode and releasing an acid labile linker, charge based linkage, or the like from the surface of the electrode.

However, since it is difficult to individually adjust a potential of each of a plurality of wells, a method of adjusting voltages of all nano well arrays is used.

SUMMARY

Provided is a bio material receiving device capable of individually controlling each of a plurality of wells in a nano well array including a plurality of the bio material receiving devices.

Provided are also methods of manufacturing and operating a bio material receiving device.

Additional aspects will be set forth in part in the description which follows and, in part, will be apparent from the description, or may be learned by practice of the presented embodiments.

Provided is a bio material receiving device including a thin film transistor ("TFT") including a drain electrode, and a nano well accommodating the bio material. The drain electrode includes the nano well.

The TFT may be a bottom gate TFT or a top gate TFT.

Provided is a nano well array including a plurality of bio material receiving devices. The bio material receiving device includes a TFT including a drain electrode, and a nano well accommodating a bio material. The drain electrode includes the nano well.

Provided is a method of manufacturing a bio material receiving device. The method includes forming a TFT including a source electrode, a drain electrode, a channel layer, and a gate electrode on a substrate, and forming a hole exposing the substrate in the drain electrode during the forming of the drain electrode.

The gate electrode may be formed below or above the channel layer.

Provided is a method of operating a bio material receiving device. The method includes confirming whether a bio material is accommodated in a nano well, and when the bio material is accommodated in the nano well, turning on a TFT of the bio material receiving device, and applying a voltage to a drain electrode of the TFT so that another bio material is not accommodated in the nano well. The drain electrode of the TFT includes the nano well, The bio material may be an enzyme or deoxyribonucleic acid.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
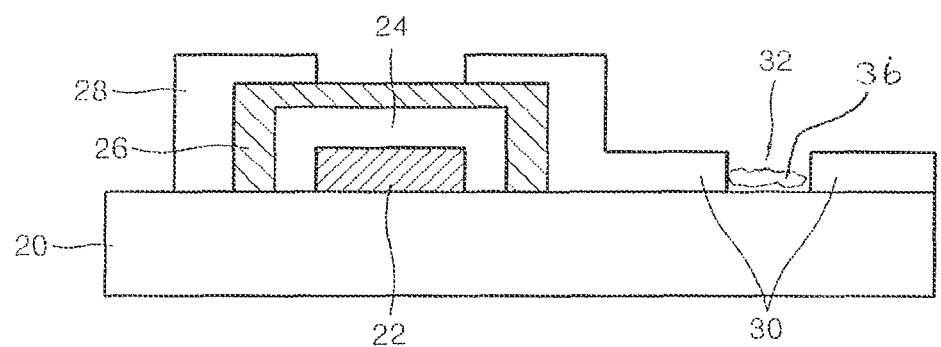
FIG. 1 is a cross-sectional view illustrating a bio material receiving device, according to an embodiment of the present invention.

Hereinafter, the present invention will be described in detail by explaining embodiments of the invention with reference to the attached drawings. The same reference numerals in the drawings denote the same element. In the drawings, the thicknesses of layers and regions are exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

FIG. 1 is a cross-sectional view illustrating a bio material receiving device, according to an embodiment of the present invention.

Referring to FIG. 1, a gate electrode 22 is on a substrate 20. The substrate 20 may be a transparent substrate, for example, a glass substrate. The gate electrode 22 is covered by a gate insulating layer 24. The gate insulating layer 24 may be a silicon oxide layer, but the present invention is not limited thereto. The gate insulating layer 24 is covered by a channel layer 26. The channel layer 26 may be an amorphous silicon layer, but the present invention is not limited thereto.

A source electrode 28 and a drain electrode 30 are on the substrate 20. The source electrode 28 and the drain electrode 30 are spaced apart from each other. The source electrode 28 contacts a first end of the channel layer 26, and the drain electrode 30 contacts a second end opposing the first end of the channel layer 26. The gate electrode 22, the source electrode 28, the drain electrode 30, the gate insulating layer 24, and the channel layer 26 may constitute a thin film transistor ("TFT"). The drain electrode 30 extends in a direction opposite to the source electrode 28, and the extended drain electrode 30 includes a hole 32 to expose the substrate 20. The hole 32 is used as a nano well accommodating bio materials, e.g., enzyme or deoxyribonucleic acid ("DNA"). The bio material 36 accommodated in the hole 32 may be selectable, and the TFT may be controlled so as to accommodate only one bio material in the hole 32.

The TFT of FIG. 1 may be covered by a protection layer. In addition, the TFT may be a top gate TFT in which the gate electrode 22 is disposed on the channel layer 26, and the channel layer 26 is between the gate electrode 22 and the substrate 20. The top gate TFT is well known, and thus a detailed description thereof will be omitted.

Figure 2:
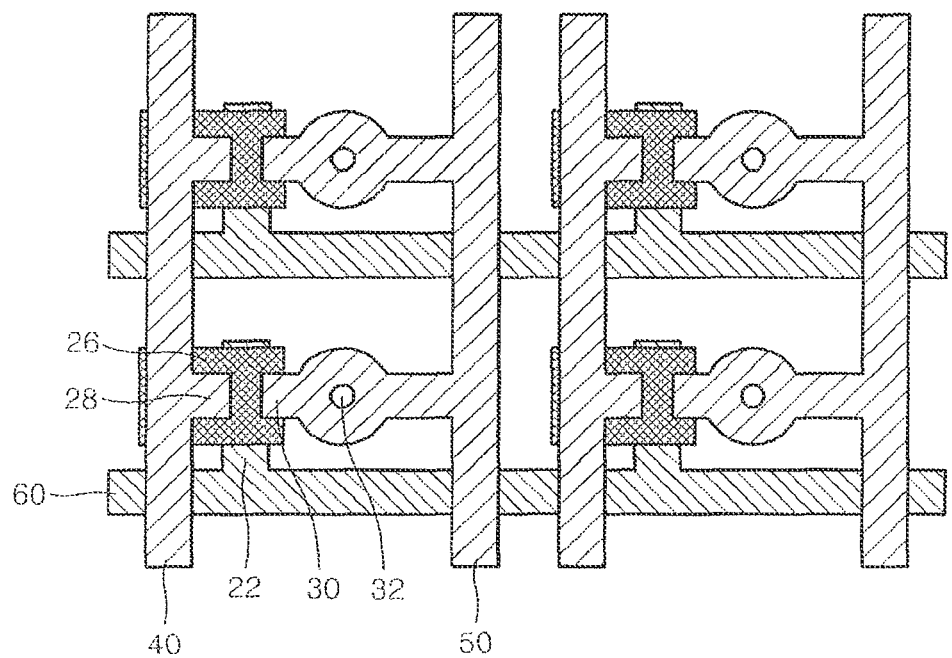
FIG. 2 is a plan view of an embodiment of a nano well array including a plurality of the bio material receiving devices of FIG. 1.

FIG. 2 is a plan view of a nano well array including a plurality of the bio material receiving devices of FIG. 1.

Referring to FIG. 2, the source electrode 28 of each bio material receiving device is connected to a source line 40, that is, to a column address line. The drain electrode 30 including the hole 32 is connected to a ground line 50. The hole 32 is in the drain electrode 30 between the channel layer 26 and the ground line 50. In addition, the gate electrode 22 of the bio material receiving device is connected to a gate line 60, that is, to a row address line.

Figure 3:
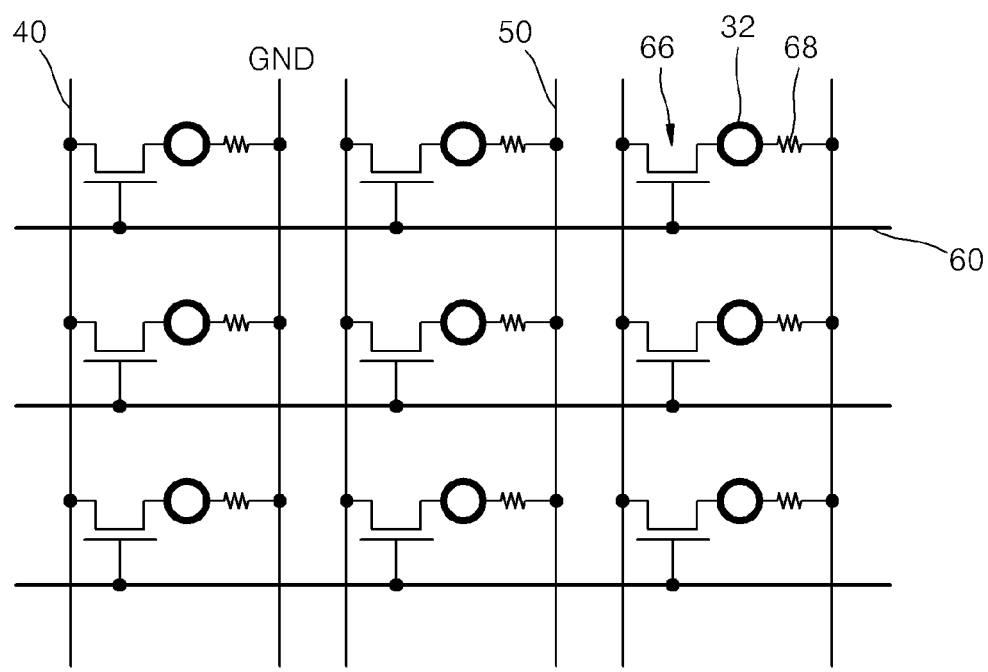
FIG. 3 is an equivalent circuit diagram illustrating the nano well array of FIG. 2.
Figure 4:
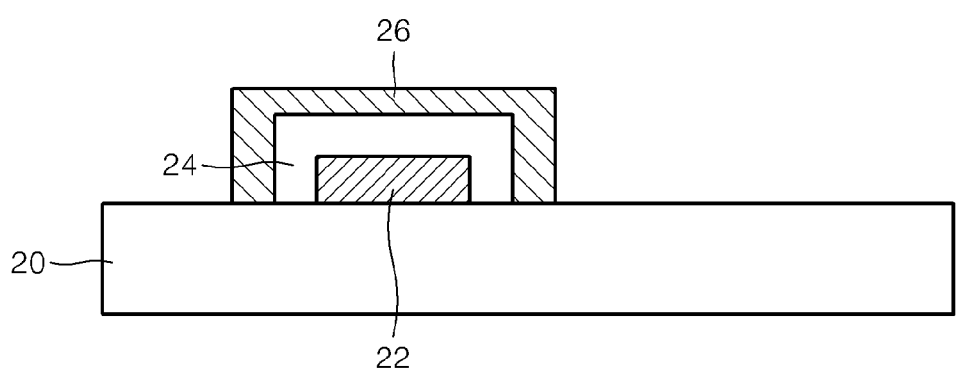
FIGS. 4 through 6 are cross-sectional views for explaining an embodiment of a method of manufacturing the bio material receiving device of FIG. 1.

FIG. 3 is an equivalent circuit diagram illustrating the nano well array of FIG. 2.

Referring to FIG. 3, a gate electrode 22 of a bio material receiving device 66 is connected to the row address line 60, and a source electrode 28 and a drain electrode 30 are respectively connected to the column address line 40 and the ground line 50. A resistance 68 between the hole 32 and the ground line 50 is a resistance of a wiring line.

With regard to FIGS. 1, 2, and 3, an electrode (not shown) may be disposed on the bio material receiving device or the nano well array. Bio material molecules may be moved in a direction of a surface of an electrode or in a direction opposite thereto by using the electrode. In addition, pH variations may be induced by increasing an amount of protons of the surface of the electrode.

Hereinafter, selection and operations of the bio material receiving device 66 will be described.

The specific column address line 40 and the row address line 60 are selected in an address decoder included in a controller (not shown) of a peripheral circuit. Thus, only a bio material receiving device 66 disposed in a region where the specific column address line 40 and the row address line 60 cross each other is selected and turned on, and the remaining bio material receiving devices 66 that are not selected are turned off. A voltage, e.g., a negative voltage, may be applied to the selected bio material receiving device 66 that is turned on. The bio material to be accommodated in the hole 32 may have negative charges or positive charges. In one embodiment, for example, an enzyme may have negative or positive charges, and DNA may have negative charges. Accordingly, the bio material accommodated in the hole 32 may be selected by adjusting the voltage applied to the hole 32.

The bio material receiving device 66 according to the embodiment of the present invention may be individually controlled in the nano well array. Accordingly, the nano well array may selectively accommodate specific bio molecules, e.g., enzyme or DNA molecules, and one nano well array may accommodate only one bio molecule.

A photo image sensor, e.g. a microscope (not shown) including a charge-coupled device ("CCD") may be included below the nano well array of FIGS. 2 and 3. The microscope may be used to confirm that a bio material is accommodated in the hole 32. Therefore, the microscope may be used to confirm whether a bio material such as enzyme or DNA is accommodated in the hole 32 of the selected bio material receiving device 66. If it is confirmed that the bio material is accommodated in the hole 32 of the selected bio material receiving device 66, a signal is transmitted from the microscope to the controller. The address decoder may control another bio material not to be accommodated in the bio material receiving device 66 by using the signal.

Hereinafter, an embodiment of a method of manufacturing the bio material receiving device of FIG. 1, that is, a device in which a nano well is coupled to a TFT will be described.

The gate electrode 22 is formed on the substrate 20. The substrate 20 may be a transparent substrate, for example, a glass substrate. The gate insulating layer 24 covering the gate electrode 22 may be formed on the substrate 20. The gate insulating layer 24 may include a silicon oxide layer. The channel layer 26 is formed on the substrate 20 so as to cover the gate insulating layer 24. The channel layer 26 may be an amorphous silicon layer.

Figure 5:
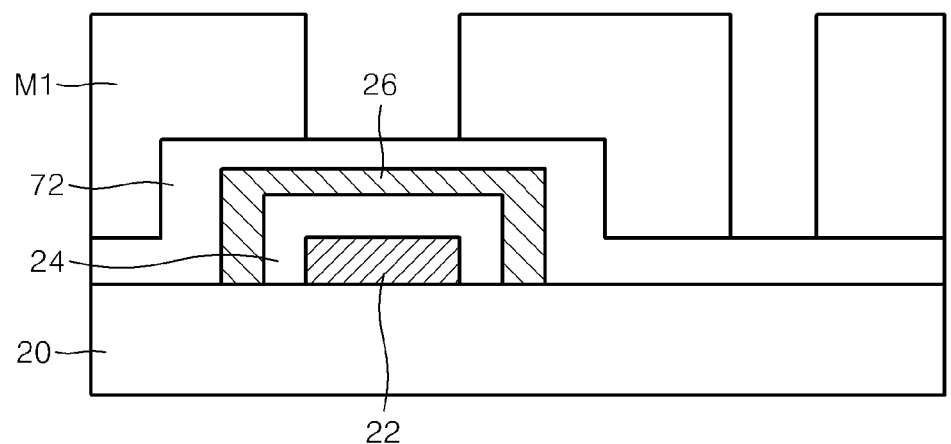

Referring to FIG. 5, a conductive layer 72 is formed on the substrate 20 so as to cover the channel layer 26. A mask M1 is formed on the conductive layer 72 so as to expose a part of the conductive layer 72. The mask M1 may be a sensitive film pattern, and may be formed so as to expose a portion of the conductive layer 72 above and aligned with the gate electrode 22, and a portion of the conductive layer 72 corresponding to the hole 32 of FIG. 1 to be formed by using a photo process. Then, the exposed portion of the conductive layer 72 is etched. The etching is performed until the channel layer 26 above the gate electrode 22, and until the substrate 20 on the right side of the channel layer 26 are exposed. Then, the mask M1 is removed.

Figure 6:
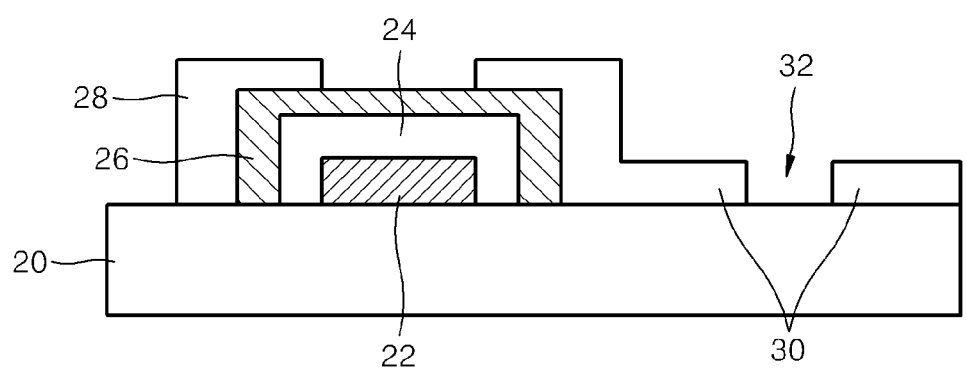

As a result, as illustrated in FIG. 6, a bio material receiving device including the source electrode 28 and the drain electrode 30 is formed, and the hole 32 used as a nano well is formed in the drain electrode 30.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A bio material receiving device comprising:
a thin film transistor including a drain electrode and a source electrode; and
a nano well to accommodate a bio material,
wherein the drain electrode includes the nano well, and the bio material is not in direct contact with the source electrode.

2. The bio material receiving device of claim 1, wherein the thin film transistor is a bottom gate thin film transistor or a top gate thin film transistor.

3. A nano well array comprising:
a plurality of bio material receiving devices, each of the bio material receiving devices comprising:
a thin film transistor including a drain electrode and a source electrode; and
a nano well to accommodate a bio material,
wherein the drain electrode includes the nano well, and the bio material is not in direct contact with the source electrode.

4. The nano well array of claim 3,
further comprising a first signal line and a second signal line each of which extend in a first direction, and a third signal line which extends in a second direction intersecting the first direction; and
the thin film transistor further including a gate electrode; and
wherein
the drain electrode is connected to the first signal line,
the source electrode is connected to the second signal line, and
the gate electrode is connected to the third signal line.

5. The nano well array of claim 4, wherein adjacent bio material receiving devices are connected to a same second signal line.

6. The nano well array of claim 5, wherein adjacent bio material receiving devices are connected to a same third signal line.

7. A method of manufacturing the bio material receiving device of claim 1, the method comprising:
forming a thin film transistor comprising a source electrode, a drain electrode, a channel layer, and a gate electrode, on a substrate; and
forming a hole exposing the substrate in the drain electrode during the forming of the drain electrode, wherein the drain electrode is in direct contact with the channel layer.

8. The method of claim 7, wherein the gate electrode is formed below or above the channel layer.

9. A method of operating a bio material receiving device, the method comprising:
confirming whether a bio material is accommodated in a nano well; and
when the bio material is accommodated in the nano well, turning on a thin film transistor of the bio material receiving device, and applying a voltage to a drain electrode of the thin film transistor so that another bio material is not accommodated in the nano well,
wherein the drain electrode of the thin film transistor includes the nano well, and the bio material is not in direct contact with a source electrode of the thin film transistor.

10. The method of claim 9, wherein the bio material is an enzyme or deoxyribonucleic acid.

* * * * *